(12) United States Patent
Morita (10) Patent No.: US 12,219,833 B2
(45) Date of Patent: Feb. 4, 2025

(54) DISPLAY DEVICE

(71) Applicant: Japan Display Inc., Tokyo (JP)

(72) Inventor: Tetsuo Morita, Tokyo (JP)

(73) Assignee: Japan Display Inc., Tokyo (JP)

( * ) Notice: Subject to any disclaimer, the term of this patent is extended or adjusted under 35 U.S.C. 154(b) by 377 days.

(21) Appl. No.: 17/676,312

(22) Filed: Feb. 21, 2022

(65) Prior Publication Data

US 2022/0181429 A1 Jun. 9, 2022

Related U.S. Application Data

(63) Continuation of application No. PCT/JP2020/027488, filed on Jul. 15, 2020.

(30) Foreign Application Priority Data

Aug. 26, 2019 (JP) ................. 2019-153730

(51) Int. Cl.
*H10K 59/131* (2023.01)
*G09G 3/3266* (2016.01)
(Continued)

(52) U.S. Cl.
CPC ......... *H10K 59/131* (2023.02); *G09G 3/3266* (2013.01); *H10K 50/841* (2023.02); *H10K 59/1213* (2023.02)

(58) Field of Classification Search
CPC ............. H10K 59/131; H10K 59/1213; H10K 59/871; H10K 59/88; H10K 50/841;
(Continued)

(56) References Cited

U.S. PATENT DOCUMENTS

2006/0208658 A1* 9/2006 Kim ................ G09G 3/3266
315/169.3
2006/0221288 A1 10/2006 Ota et al.
(Continued)

FOREIGN PATENT DOCUMENTS

JP 2006-276590 A 10/2006
JP 2019-015900 A 1/2019

OTHER PUBLICATIONS

Office Action of Jul. 12, 2022, for corresponding Indian Patent Application No. 202217008262.
(Continued)

*Primary Examiner* — Sitaramarao S Yechuri
(74) *Attorney, Agent, or Firm* — Michael Best & Friedrich LLP (57) ABSTRACT

A display device includes: a plurality of pixel electrodes; a plurality of pixel circuits below the plurality of pixel electrodes; some scan lines, each of the scan lines being connected to a corresponding one group of the plurality of pixel circuits; and a scan drive circuit configured to selectively send scanning signals to the scan lines. The plurality of pixel electrodes include effective pixel electrodes corresponding to respective pixels constituting a displayed image, and dummy pixel electrodes between the effective pixel electrodes and the scan drive circuit and corresponding to none of the respective pixels. Each of the effective pixel electrodes is connected to a corresponding one of the plurality of pixel circuits. Each of the scan lines is electrically connected to the scan drive circuit through a corresponding at least one of the dummy pixel electrodes.

9 Claims, 11 Drawing Sheets

(51) Int. Cl.
*H10K 50/84* (2023.01)
*H10K 59/121* (2023.01)

(58) Field of Classification Search
CPC ......... G09G 3/3266; G09G 2300/0413; G09G 2300/0426; G09G 2330/04; G09F 9/30; G09F 9/33; H05B 33/02; H05B 33/04; H05B 33/12; H05B 33/22; H05B 33/26
See application file for complete search history.

(56) References Cited

U.S. PATENT DOCUMENTS

| | | | |
|---|---|---|---|
| 2009/0073368 A1* | 3/2009 | Wang | G02F 1/134309 349/143 |
| 2016/0315133 A1 | 10/2016 | Sato | |
| 2019/0012974 A1 | 1/2019 | Miyanaga | |

OTHER PUBLICATIONS

International Search Report mailed on Sep. 29, 2020, for the PCT Application No. PCT/JP2020/027488, with English machine translation.

\* cited by examiner

DISPLAY DEVICE

CROSS-REFERENCE TO RELATED APPLICATION

This application is a continuation application of International Application PCT/JP2020/027488 filed on Jul. 15 2020, which claims priority from Japanese patent application JP2019-153730 filed on Aug. 26, 2019. The contents of these applications are incorporated herein by reference in their entirety.

BACKGROUND

1. Field

This disclosure relates to a display device.

2. Description of the Related Art

An active-matrix display panel has a display area in which pixel electrodes are arranged in a matrix pattern, a scan line for each pixel row, and a video signal line for each pixel column and intersecting the scan line (JP 2019-015900). Circuits for inputting signals to each scan line and each video signal line are located in an area (frame area) outside the display area. Specifically, the pixel row is selected by a scanning signal applied to the scan line from a scan drive circuit, and a video signal is input to the video signal line from a signal drive circuit.

A manufacturing method of the display panel includes multiple deposition processes. The deposition processes require countermeasures against electrostatic discharge (ESD). The scan drive circuit is susceptible to static electricity applied to the scan line due to being electrically connected to the scan line.

SUMMARY

This disclosure aims to reduce effects of static electricity.

A display device includes: a plurality of pixel electrodes; a plurality of pixel circuits below the plurality of pixel electrodes; some scan lines, each of the scan lines being connected to a corresponding one group of the plurality of pixel circuits; and a scan drive circuit configured to selectively send scanning signals to the scan lines. The plurality of pixel electrodes include effective pixel electrodes corresponding to respective pixels constituting a displayed image, and dummy pixel electrodes between the effective pixel electrodes and the scan drive circuit and corresponding to none of the respective pixels. Each of the effective pixel electrodes is connected to a corresponding one of the plurality of pixel circuits. Each of the scan lines is electrically connected to the scan drive circuit through a corresponding at least one of the dummy pixel electrodes.

The scan drive circuit is not affected by static electricity until it is electrically connected to the scan lines through the dummy pixel electrodes in a manufacturing process.

DETAILED DESCRIPTION

Embodiments of the present invention will now be described with reference to the drawings. However, the present invention can be implemented in various forms to the extent that it does not depart from the gist thereof, and is not to be construed as limited to the description of the embodiments illustrated below.

The drawings may be represented schematically with respect to the width, thickness, shape, etc. of each part compared to the actual state for the purpose of clarifying the description, but they are only examples and do not limit the interpretation of the present invention. In this specification and each figure, elements having the same functions as those already described with respect to the figures may be marked with the same sign and duplicate explanations may be omitted.

Furthermore, in the detailed description of the present invention, when specifying the positional relationship between one component and another component, "above" and "below" shall include not only cases where the component is located directly above or directly below a certain component, but also cases where a further component is interposed in between, unless otherwise specified.

First Embodiment

Figure 1:
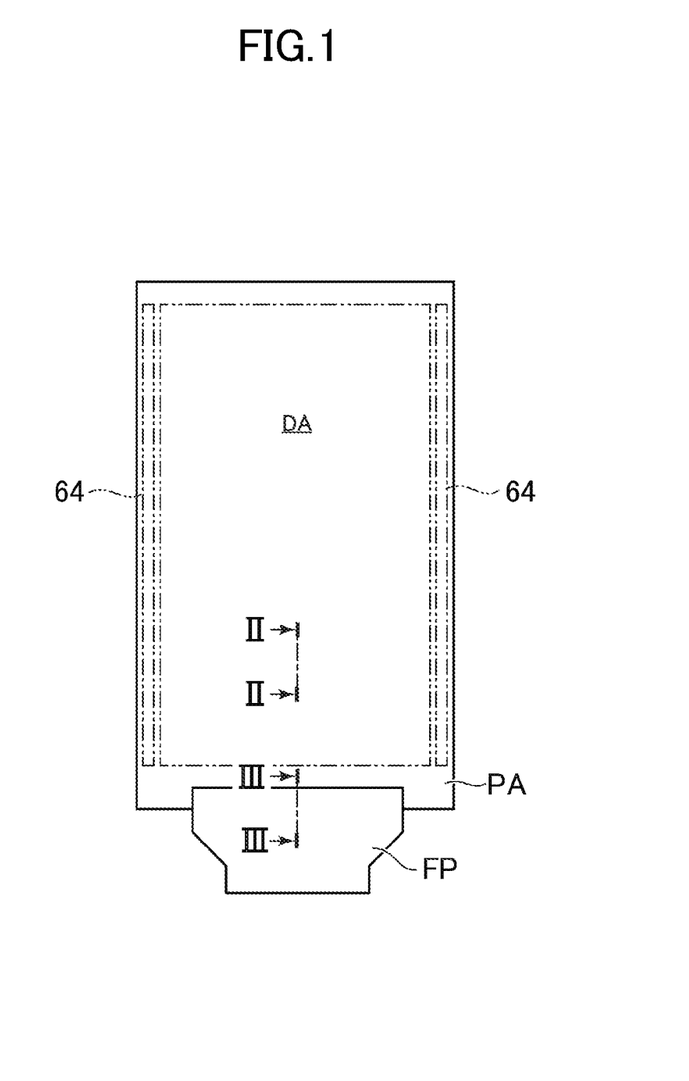
FIG. 1 is a plan view of a display device according to a first embodiment.

FIG. 1 is a plan view of a display device according to a first embodiment. The display device is configured to display a full-color image by combining unit pixels (sub-pixels) in some colors such as red, green, and blue to form a full-color pixel.

The display device has a display area DA in which an image is displayed. The display device has a peripheral area PA around the display area DA. The peripheral area PA is outside the display area DA. A flexible printed circuit board FP is connected to the peripheral area PA.

Figure 2:
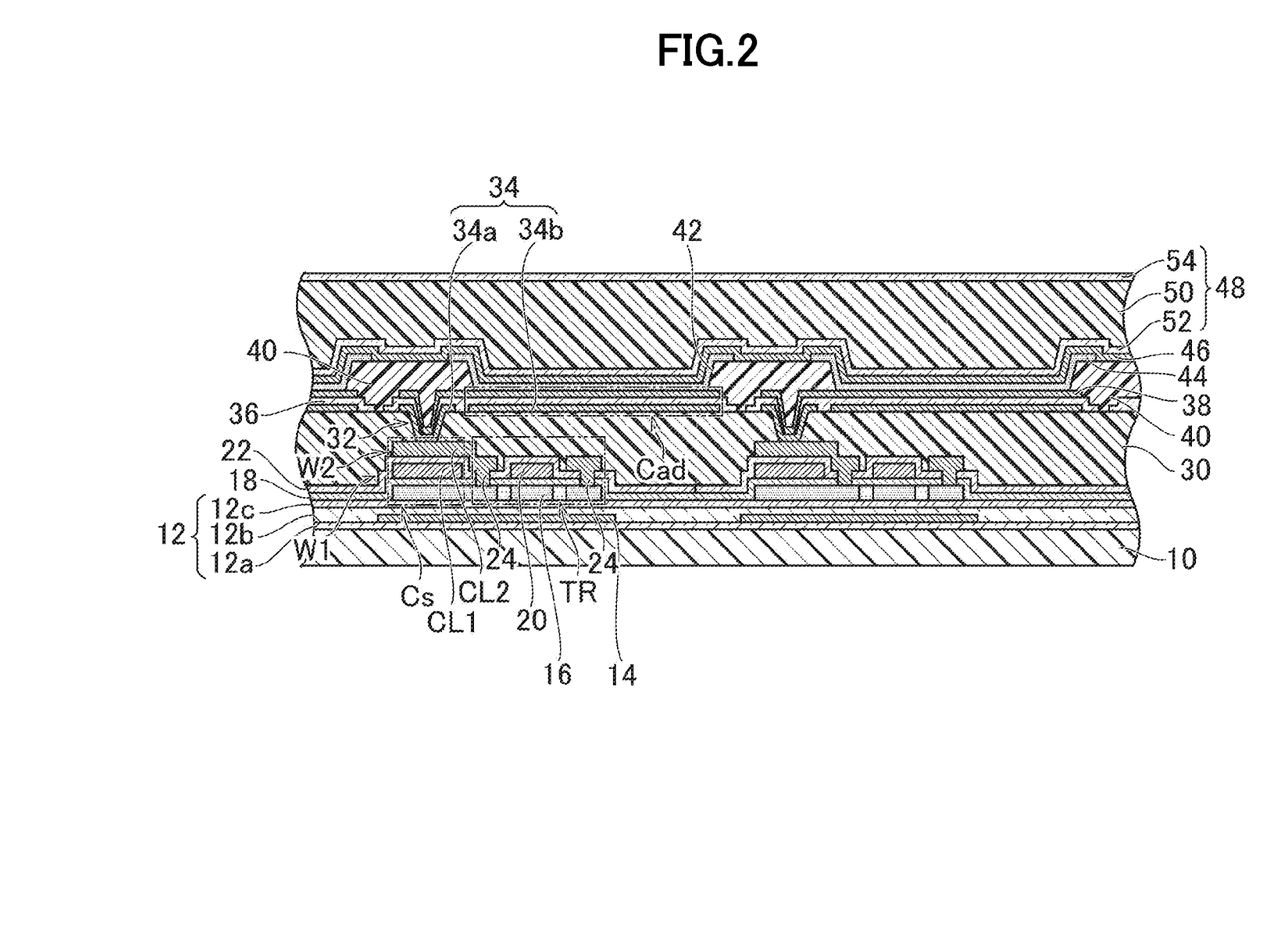
FIG. 2 is a II-II cross-sectional view of the display device in FIG. 1.
Figure 3:
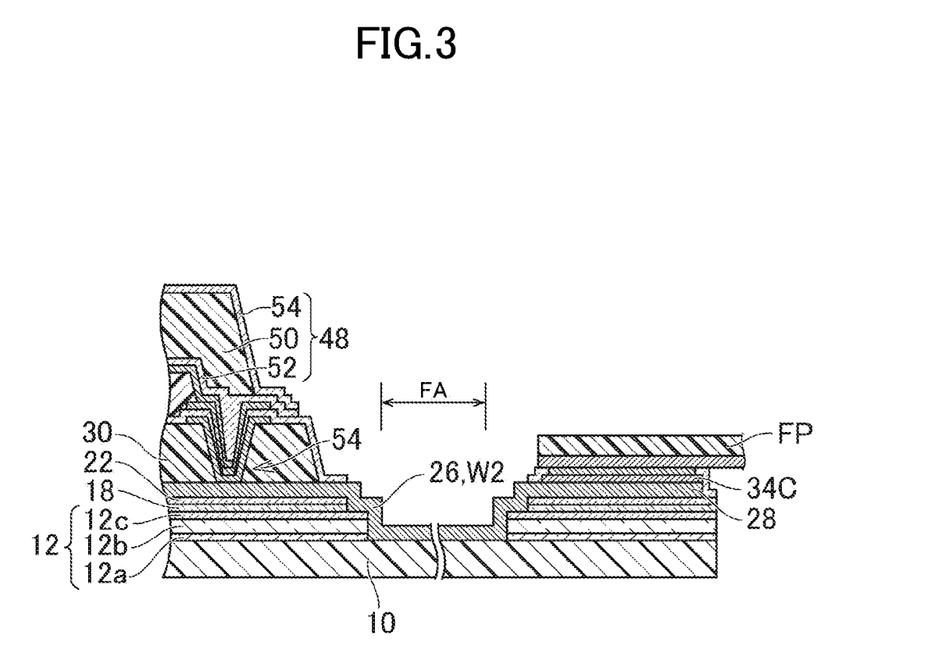
FIG. 3 is a III-III cross-sectional view of the display device in FIG. 1.

FIG. 2 is a II-II cross-sectional view of the display device in FIG. 1. FIG. 3 is a III-III cross-sectional view of the display device in FIG. 1. The substrate 10 (array substrate) is composed of a resin material having flexibility, such as a polyimide, if it is required to be bent.

A three-layer laminated structure of a silicon oxide film 12a, a silicon nitride film 12b, and a silicon oxide film 12c is provided on the substrate 10, as an undercoat layer 12. The lowermost silicon oxide film 12a is provided to improve adhesion to the substrate 10, the middle silicon nitride film 12b is provided for a blocking film against external moisture and impurities, and the uppermost silicon oxide film 12c is provided as a blocking film for preventing hydrogen atoms contained in the silicon nitride film 12b from diffusing into a semiconductor layer 16 of a thin film transistor TR, although this structure is substitutable and a single layer or a two-layer lamination may be employed.

Under the undercoat layer 12 or between layers, an additional film 14 may be formed at a location where the thin film transistor TR is to be formed. The additional film 14 can suppress changes in characteristics of the thin film transistor TR due to penetration of light from a back of a channel, or can give a back gate effect to the thin film transistor TR by being formed from a conductive material to provide a predetermined potential to the thin film transistor TR. Here, after forming the silicon oxide film 12a, the additional film 14 is formed in an island shape in accordance with the location where the thin film transistor TR is formed, and then the silicon nitride film 12b and the silicon oxide film 12c are laminated, whereby the additional film 14 is sealed in the undercoat layer 12, or, alternatively, the additional film 14 may be formed first on the substrate 10, and then the undercoat layer 12 may be formed.

The thin film transistor TR is formed on the undercoat layer 12. A polysilicon thin film transistor is used as an example, and only an Nch transistor is shown here, but a Pch transistor may be formed at the same time. A semiconductor layer 16 of the thin film transistor TR has a structure in which a low-concentration impurity region is provided between a channel region and a source/drain region. As a gate insulation film 18, a silicon oxide film is used here.

The gate electrode 20 is part of a first conductive layer W1 formed from a molybdenum tungsten alloy. In addition to the gate electrode 20, the first conductive layer W1 includes a first holding capacitance line CL1. Part of a holding capacitance Cs is formed between the first holding capacitance line CL1 and the semiconductor layer 16 (source/drain region), and through the gate insulation film 18.

An interlayer insulation film 22 (silicon oxide film, silicon nitride film) is laminated on the gate electrode 20. For making the substrate 10 bendable, at least part of the interlayer insulation film 22 is removed, in a folding area FA shown in FIG. 3, to be made easily bendable. The removal of the interlayer insulation film 22 exposes the undercoat layer 12, and at least part thereof is also removed by patterning. After the undercoat layer 12 is removed, the polyimide constituting the substrate 10 is exposed. Through an etching of the undercoat layer 12, the polyimide may have a surface partially eroded and decrease in film thickness.

On the interlayer insulation film 22, a second conductive layer W2 is formed to have portions to be a source/drain electrode 24 and a wiring line 26. Herein, a three-layer laminated structure of titanium, aluminum, and titanium is employed. Other part of the holding capacitance Cs is formed between the first holding capacitance line CL1 (part of the first conductive layer W1) and a second holding capacitance line CL2 (part of the second conductive layer W2), and through the interlayer insulation film 22. The wiring line 26 extends to an edge of the substrate 10 and has a terminal 28 for being connected to the flexible printed circuit board FP.

A planarization film 30 is provided to cover the source/drain electrode 24 and the wiring line 26 (excluding part thereof). The planarization film 30 is often formed from an organic resin such as a photosensitive acrylic because of superiority in surface flatness to an inorganic insulating material possibly formed by CVD (Chemical Vapor deposition).

The planarization film 30 is removed at a pixel contact portion 32 and in the peripheral area PA, and has an indium tin oxide (ITO) film 34 formed thereon. The indium tin oxide film 34 includes a first transparent conductive film 34a and a second transparent conductive film 34b that are separated from each other.

The second conductive layer W2, whose surface is exposed by removal of the planarization film 30, is covered with the first transparent conductive film 34a. A silicon nitride film 36 is provided on the planarization film 30 to cover the first transparent conductive film 34a. The silicon nitride film 36 has an opening at the pixel contact portion 32 and an effective pixel electrode 38 is laminated to be electrically continuous to the source/drain electrode 24 through the opening. The effective pixel electrode 38 is formed as a reflective electrode and has a three-layer laminated structure of an indium zinc oxide film, a silver film, and an indium zinc oxide film. Here, an indium tin oxide film may be used in place of the indium zinc oxide film. The effective pixel electrode 38 laterally extends from the pixel contact portion 32 to above the thin film transistor TR.

The second transparent conductive film 34b is provided adjacent to the pixel contact portion 32 and below the effective pixel electrode 38 (further below the silicon nitride film 36). The second transparent conductive film 34b, the silicon nitride film 36, and the effective pixel electrode 38 overlap with one another to form an additional capacitance Cad.

As shown in FIG. 3, a third transparent conductive film 34c, which is other part of the indium tin oxide film 34, is formed on the surface of the terminal 28. The third transparent conductive film 34c is formed at the same time as the first transparent conductive film 34a and the second transparent conductive film 34b. The third transparent conductive film 34c on the terminal 28 aims to be a barrier film to prevent the exposed portion of the terminal 28 from being damaged in subsequent processes. While the effective pixel electrode 38 is being shaped, the third transparent conductive film 34c is exposed to an etching environment, but an annealing process performed between formation of the indium tin oxide film 34 and formation of the effective pixel electrode 38 makes the indium tin oxide film 34 sufficiently resistant to an etching of the effective pixel electrode 38.

An insulation layer 40, which is called a bank (rib) and serves as a barrier between adjacent pixel regions, is formed, for example, on the planarization film 30 and above the pixel contact portion 32. A photosensitive acrylic is used as the insulation layer 40, like the planarization film 30.

The insulation layer 40 has a plurality of openings 42 that expose central portions of the respective effective pixel electrodes 38. The openings 42 expose surfaces of the effective pixel electrode 38 as light emitting areas. An inner peripheral surface of the opening 42 should have a gently tapered shape. The insulation layer 40 covers respective peripheral edges of the effective pixel electrodes 38.

The planarization film 30 and the insulation layer 40 are in contact with each other through holes in the silicon nitride film 36 between them. This allows moisture and gases that are desorbed from the planarization film 30 to be drawn out through the insulation layer 40 during heat treatment after formation of the insulation layer 40.

An electroluminescence layer 44 made of organic materials is placed on the effective pixel electrodes 38. The electroluminescence layer 44 may be a single layer, or may be a structure in which a hole transport layer, a light emitting layer, and an electron transport layer are laminated in order from the effective pixel electrode 38. These layers may be formed by vapor deposition or by dispersion and coating of a solvent, or may be selectively formed on the effective pixel electrodes 38 (respective sub-pixels), or may be formed all over the entire surface including the display area DA. Also, some layers may be fully formed and other layers may be formed selectively to the effective pixel electrodes 38. The fully formed light emitting layer may be configured to emit white light in all the sub-pixels, and desired color wavelength portions can be extracted through a color filter (not shown).

A common electrode 46 is placed on the electroluminescence layer 44. Here, a top emission structure is adopted, and the common electrode 46 is transparent. For example, a magnesium layer and a silver layer are formed as a thin film enough to pass light emitted from the electroluminescence layer 44. For example, the effective pixel electrodes 38 become anodes and the common electrode 46 becomes a cathode. The common electrode 46 is formed over the display area DA and a cathode contact portion 54 (FIG. 3) provided near the display area DA, and is connected at the cathode contact portion 54 to the wiring line 26 below it to be electrically connected to terminal 28.

A seal layer 48 is formed on the common electrode 46. The seal layer 48 covers the electroluminescence layer 44. The seal layer 48 has a function to prevent external moisture from entering the electroluminescence layer 44, requiring a high gas barrier property. The seal layer 48 has a lamination structure including silicon nitride, such as a lamination structure of an organic film 50 made of resin, and a pair of inorganic films 52, (e.g., silicon nitride films) sandwiching it from above and below. A silicon oxide film or an amorphous silicon layer may be provided between each of the inorganic films 52, 54 and the organic film 50 for a purpose of improving adhesiveness. A cover glass or a touch panel substrate may be provided on the seal layer 48, if necessary. In this case, a filler using a resin may be used to fill a void between the seal layer 48 and the cover glass or the touch panel.

Figure 4:
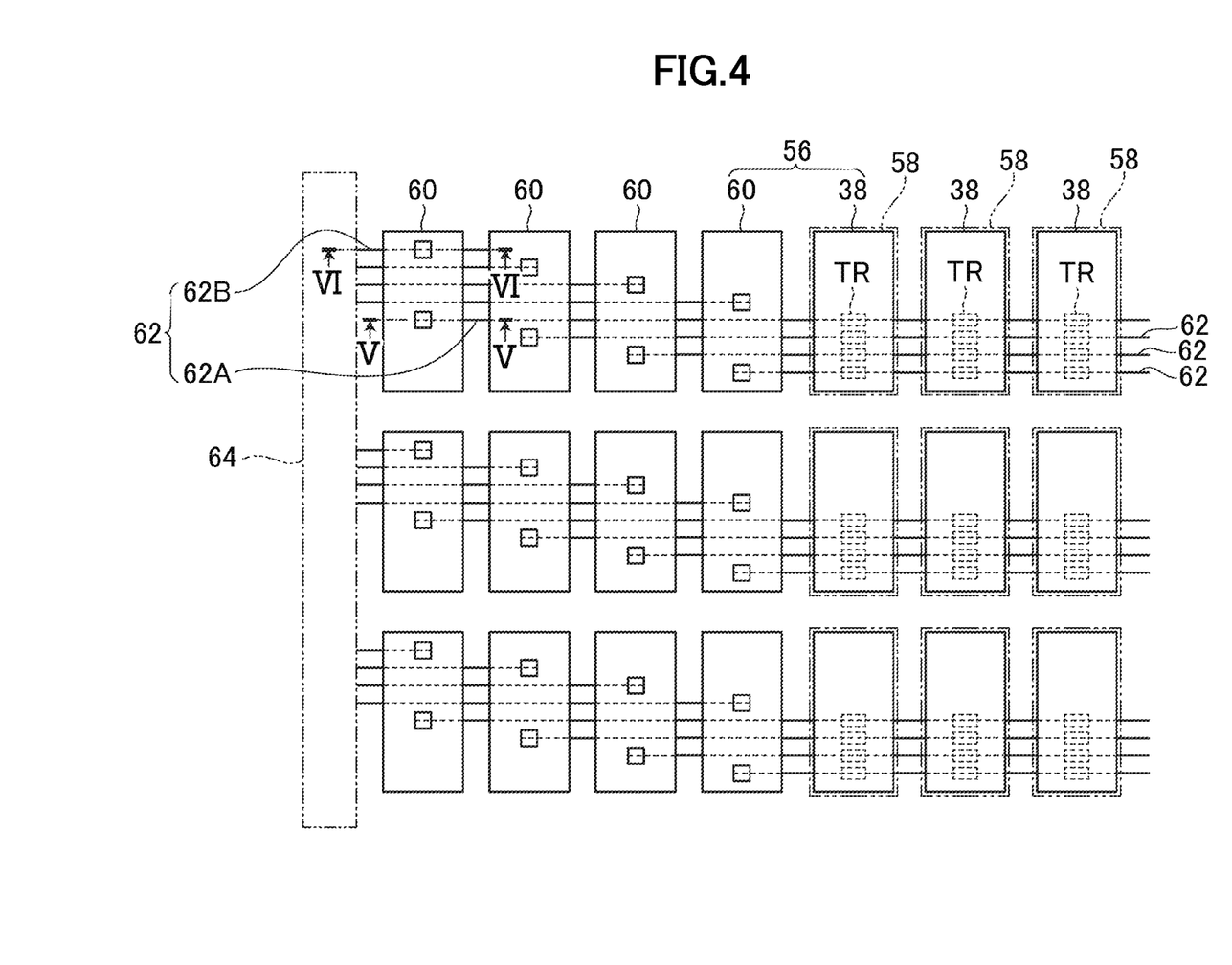
FIG. 4 is an enlarged plan view of part of a display area in FIG. 1.
Figure 5:
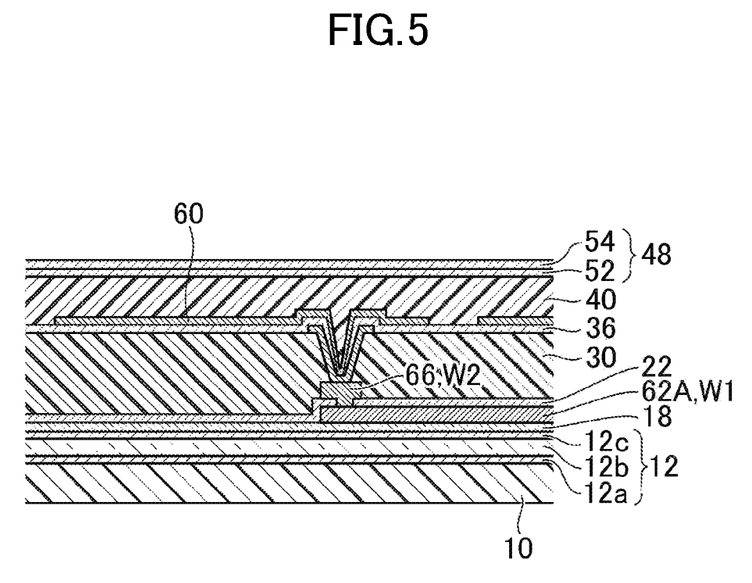
FIG. 5 is a V-V cross-sectional view of a structure in FIG. 4.
Figure 6:
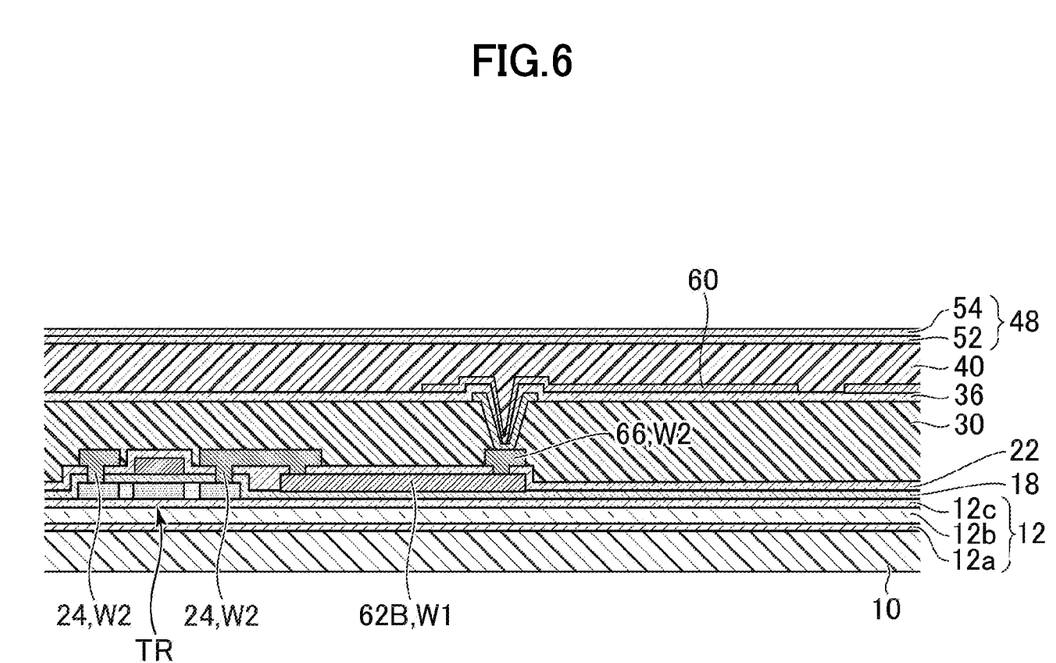
FIG. 6 is a VI-VI cross-sectional view of the structure in FIG. 4.

FIG. 4 is an enlarged plan view of part of a display area DA in FIG. 1. FIG. 5 is a V-V cross-sectional view of a structure in FIG. 4. FIG. 6 is a VI-VI cross-sectional view of the structure in FIG. 4.

The display device has a plurality of pixel electrodes 56. The effective pixel electrodes 38 are included in the plurality of pixel electrodes 56. The effective pixel electrodes 38 correspond to the respective pixels constituting the image to be displayed and contribute to light emission.

The display device has a plurality of pixel circuits 58. The plurality of pixel circuits 58 are below the plurality of pixel electrodes 56 (effective pixel electrodes 38). Each pixel circuit 58 includes the thin film transistor TR shown in FIG. 2, and further includes another thin film transistor TR. Each effective pixel electrode 38 is connected to a corresponding one of the plurality of pixel circuits 58. The pixel circuit 58 (thin film transistor TR) is configured to control a current or a voltage through the effective pixel electrode 38.

The plurality of pixel electrodes 56 include dummy pixel electrodes 60. The dummy pixel electrodes 60 correspond to none of the pixels constituting the image to be displayed. In other words, the dummy pixel electrodes 60 do not contribute to the light emission. The electroluminescence layer 44 overlap with none of the dummy pixel electrodes 60. In other words, the electroluminescence layer 44 does not exist under the dummy pixel electrodes 60. Each effective pixel electrode 38 and each dummy pixel electrode 60 have the same planar shape. In FIG. 4, they are all rectangular in shape for simplicity, but if the effective pixel electrodes 38 have different shapes, the dummy pixel electrodes 60 correspond to them.

The insulation layer 40 is interposed between the pixel electrodes 56 (each effective pixel electrode 38, each dummy pixel electrode 60) and the common electrode 46. The insulation layer 40 covers an entirety of each dummy pixel electrode 60. That is, the insulation layer 40 has no openings 42 corresponding to the dummy pixel electrode 60.

The display device has some scan lines 62. The scan lines 62 are part of the first conductive layer W1 shown in FIG. 2. Each scan line 62 is connected to a corresponding one group of the plurality of pixel circuits 58. Each pixel circuit 58 is connected to corresponding two or more of the scan lines 62. The gate electrode of the thin film transistor TR is connected to a corresponding one of the scan lines 62.

A scan drive circuit 64 is provided in the peripheral area PA (FIG. 1). Scanning signals are selectively sent from the scan drive circuit 64 to the scan lines 62. As shown in FIG. 4, the dummy pixel electrodes 60 are located between the effective pixel electrodes 38 and the scan drive circuit 64. Each scan line 62 is electrically connected to the scan drive circuit 64 through a corresponding at least one of the dummy pixel electrodes 60.

In detail, each scan line 62 is separated into multiple sections 62A, 62B. The multiple sections 62A, 62B are electrically connected through the corresponding at least one of the dummy pixel electrodes 60.

Also the scan drive circuit 64 includes the thin film transistor TR. The scan line 62 is connected to the source/drain electrode 24 of the thin film transistor TR of the scan drive circuit 64 (FIG. 6). Additionally, the scan line 62 is connected to the gate electrode 20 of the thin film transistor TR of the pixel circuit 58 (FIG. 2).

The second conductive layer W2 is interposed between the pixel electrodes 56 (each effective pixel electrode 38, each dummy pixel electrode 60) and the scan lines 62. The second conductive layer W2 (FIG. 2) between the effective pixel electrodes 38 and the scan lines 62 includes the source/drain electrode 24 of the thin film transistor TR. As shown in FIGS. 5 and 6, the second conductive layer W2 includes a connection portion 66 electrically connecting each scan line 62 to the corresponding at least one of the dummy pixel electrodes 60. As shown in FIG. 6, the second conductive layer W2 also includes the source/drain electrode 24 of the thin film transistor TR of the scan drive circuit 64.

According to the present embodiment, the scan drive circuit 64 is not affected by static electricity until it is electrically connected to the scan lines 62 through the dummy pixel electrodes 60 in manufacturing processes. The dummy pixel electrodes 60 are located higher than the thin film transistors TR, the first conductive layer W1, and the second conductive layer W2, whereby the scan drive circuit 64 is not affected by the static electricity until an end of the manufacturing processes, even if the static electricity enters the scan lines 62 provided in the display area DA.

As shown in FIG. 2, the seal layer 48 includes the pair of inorganic films 52, 54 and the organic film 50, above the effective pixel electrodes 38. By contrast, as shown in FIGS. 5 and 6, above the dummy pixel electrodes 60, the seal layer 48 does not include the organic film 50, whereby the pair of inorganic films 52, 54 are in contact with each other.

Second Embodiment

Figure 7:
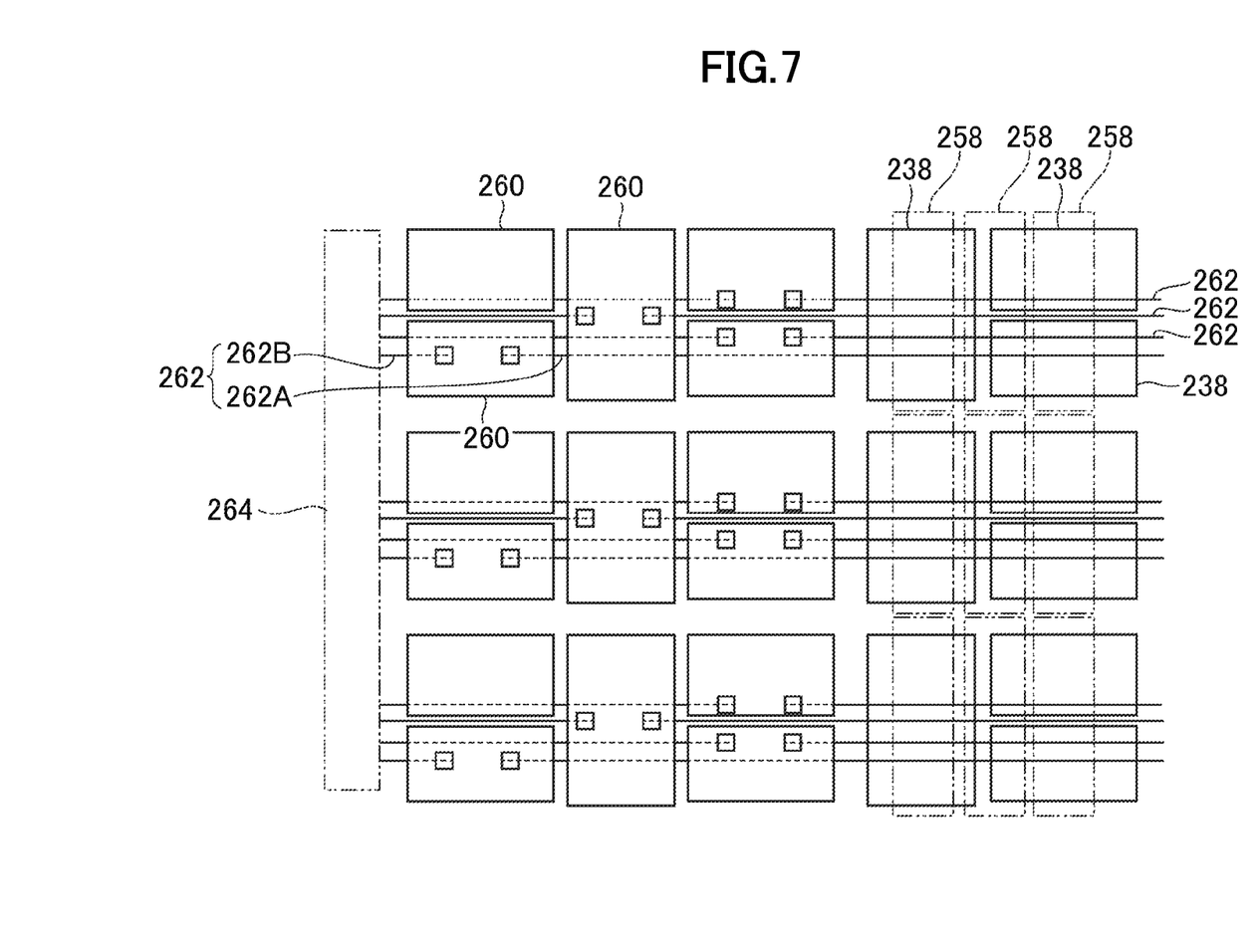
FIG. 7 is an enlarged plan view of part of a display area of a display device according to a second embodiment.

FIG. 7 is an enlarged plan view of part of a display area DA of a display device according to a second embodiment.

Figure 8:
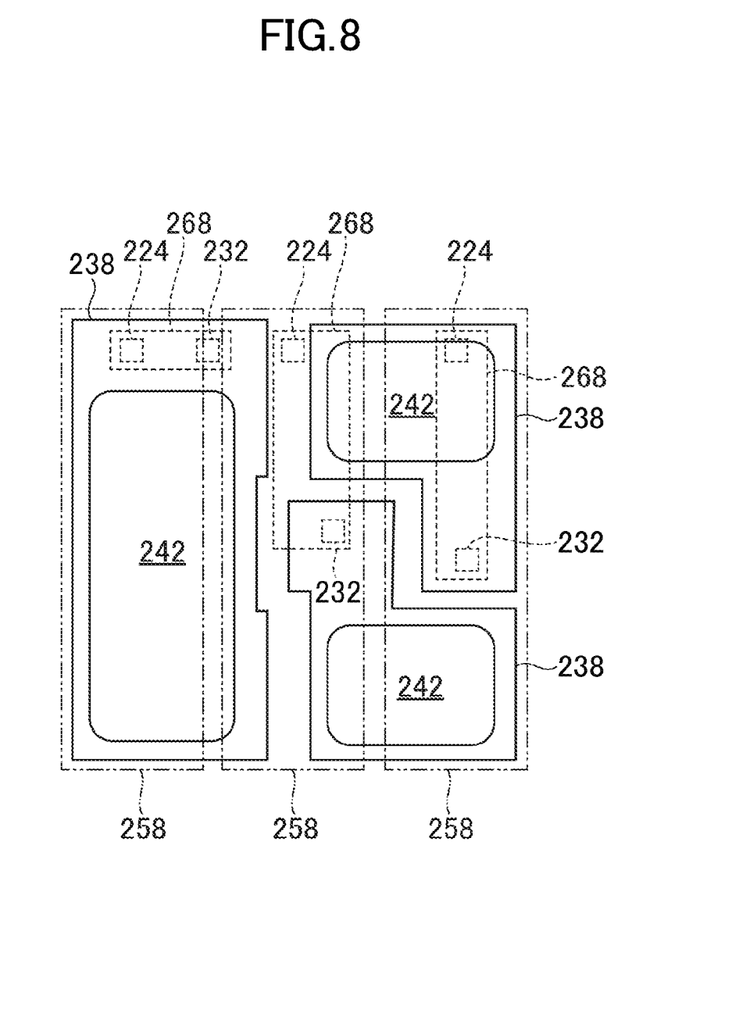
FIG. 8 is a detailed plan view of an arrangement of effective pixel electrodes in FIG. 7.

This embodiment differs from the first embodiment in an arrangement of the pixel electrodes. FIG. 8 is a detailed plan view of an arrangement of effective pixel electrodes in FIG. 7.

An arrangement of the pixel circuits 258 is a stripe arrangement, while an arrangement of the effective pixel electrodes 238 is another arrangement (e.g., delta arrangement, square arrangement, pentagonal arrangement). The effective pixel electrodes 238 have different shapes depending on light emitting colors. Also, the effective pixel electrodes 238 have different sizes depending on the light emitting colors, and for example, the effective pixel electrode 238 corresponding to blue is the largest. The openings 242 of the insulation layer serve as light emitting areas, entirely inside which the electroluminescence layer is on the effective pixel electrodes 238. The light emitting areas also have different sizes depending on the light emitting colors.

The pixel contact portion 232 of the effective pixel electrode 238 is connected to the connection electrode 268 (part of the second conductive layer W2 in FIG. 2). The connection electrode 268 extends integrally and continuously from the source/drain electrode 224 (part of the second conductive layer W2 in FIG. 2). By changing a design of the connection electrode 268, without changing the arrangement of the pixel circuits 258, the effective pixel electrodes 238 can be changed in arrangement or shape.

The dummy pixel electrodes 260 are in the same arrangement as the effective pixel electrodes 238. The scan line 262 is separated into multiple sections 262A, 262B. The multiple sections 262A, 262B are electrically connected through the dummy pixel electrodes 260. Thus, the scan line 262 is connected to the scan drive circuit 264. The other contents are the same as those described in the first embodiment.

Third Embodiment

Figure 9:
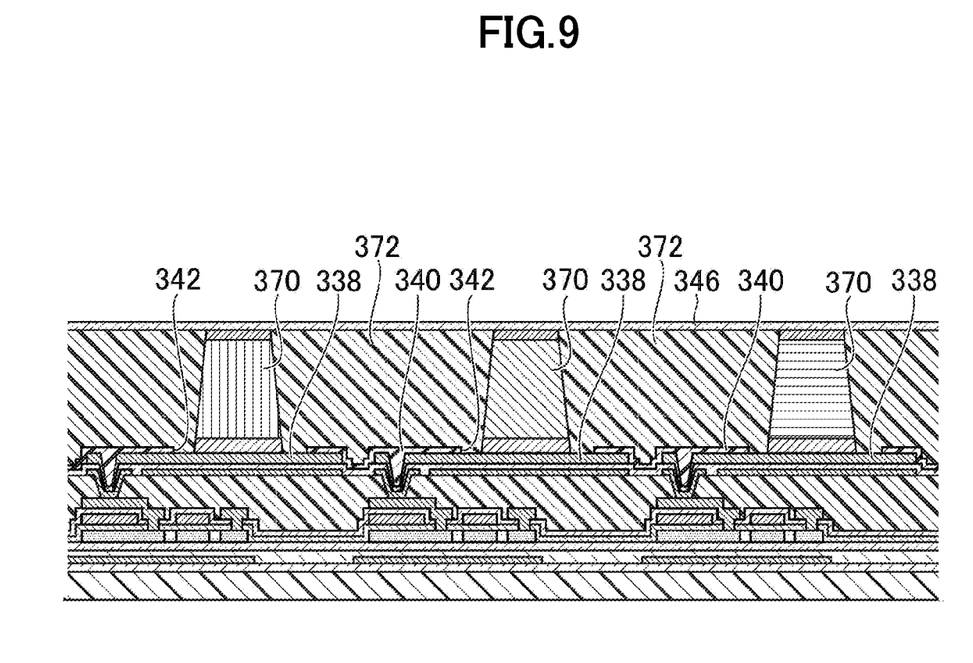
FIG. 9 is a cross-sectional view of a display device according to a third embodiment.

FIG. 9 is a cross-sectional view of a display device according to a third embodiment. This embodiment differs from the second embodiment in that micro-LED chips 370 are used. The micro-LED chips 370 avoid overlap with the dummy pixel electrodes, and are placed on the respective effective pixel electrodes 338. The effective pixel electrodes 338 are electrically continuous to bottom electrodes of the micro-LED chips 370. The common electrode 346 is placed on the micro-LED chips 370 and is electrically continuous to an upper electrode thereof. If the micro-LED chips 370 have a high moisture resistance, the seal layer may be omitted.

An element insulation film 372 is provided between the adjacent micro-LED chips 370. Upper surfaces of the element insulation film 372 and the micro-LED chips 370 are of the same height. Thus, the common electrode 346 is formed on a flat surface.

Figure 10:
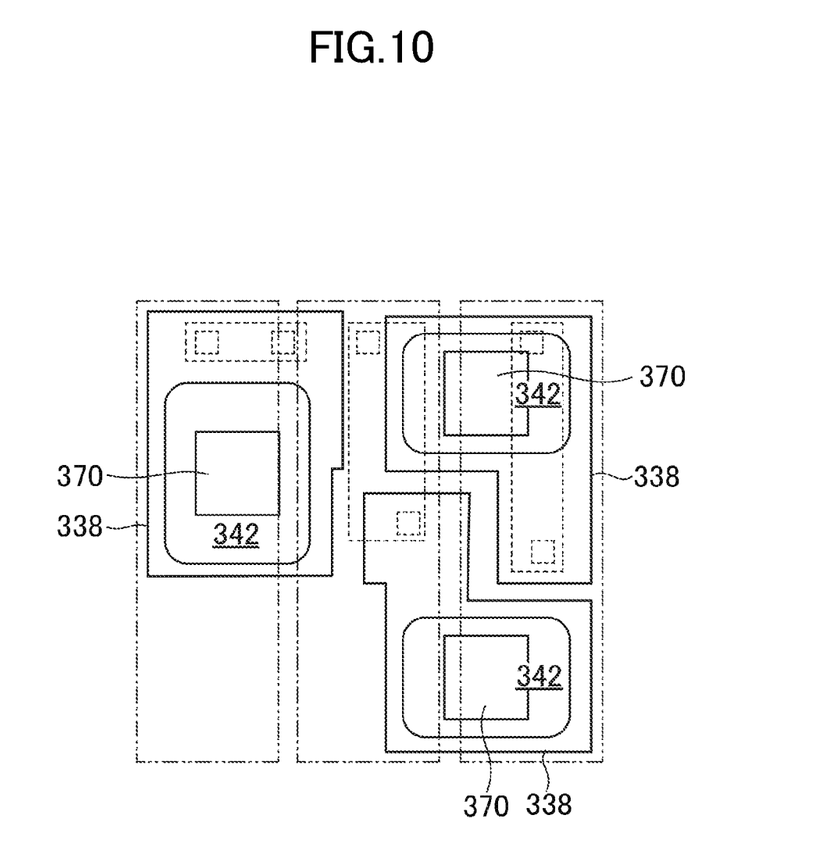
FIG. 10 is a detailed plan view of an arrangement of effective pixel electrodes in FIG. 9.

FIG. 10 is a detailed plan view of an arrangement of effective pixel electrodes 338 in FIG. 9. The pixel electrodes are covered with the insulation layer 340 having openings 342. The openings 342 expose the effective pixel electrodes 338 to mount the micro-LED chips 370 on them. The openings 342 are larger than the micro-LED chips 370 with a gap between them. This gap is covered with the element insulation film 372. The other contents are the same as those described in the second embodiment.

Fourth Embodiment

Figure 11:
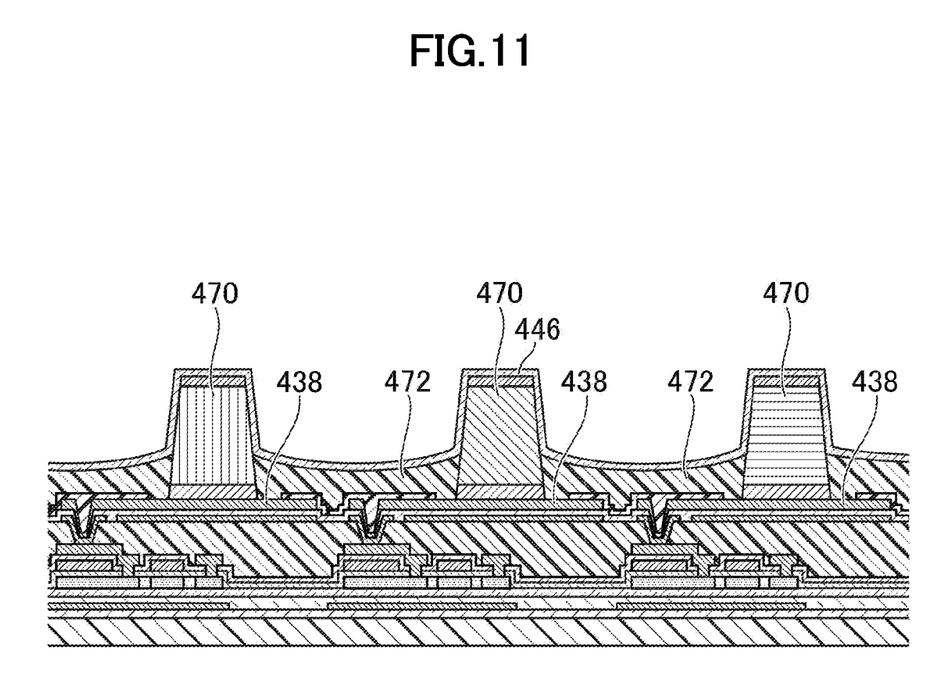
FIG. 11 is a cross-sectional view of a display device according to a fourth embodiment.

FIG. 11 is a cross-sectional view of a display device according to a fourth embodiment. In this embodiment, the element insulation film 472 is lower than the micro-LED chips 470. Thus, an uneven surface is formed and the common electrode 446 is formed on it. The effective pixel electrodes 438 and the common electrode 446 are insulated by the element insulation film 472. The other contents are the same as those described in the third embodiment.

The embodiments described above are not limited and different variations are possible. The structures explained in the embodiments may be replaced with substantially the same structures and other structures that can achieve the same effect or the same objective.

What is claimed is:

1. A display device comprising:
   a plurality of pixel electrodes;
   a plurality of pixel circuits below the plurality of pixel electrodes;
   some scan lines, each of the scan lines being connected to a corresponding one group of the plurality of pixel circuits; and
   a scan drive circuit configured to selectively send scanning signals to the scan lines,
   wherein
   the plurality of pixel electrodes include effective pixel electrodes corresponding to respective pixels constituting a displayed image, and dummy pixel electrodes between the effective pixel electrodes and the scan drive circuit and corresponding to none of the respective pixels,
   each of the effective pixel electrodes is connected to a corresponding one of the plurality of pixel circuits,
   each of the scan lines is electrically connected to the scan drive circuit through a corresponding at least one of the dummy pixel electrode, and
   each of the plurality of pixel circuits includes a thin film transistor with a gate electrode, the gate electrode being connected to a corresponding one of the scan lines.

2. The display device according to claim 1, wherein
   each of the scan lines is separated into multiple sections, and
   the multiple sections are electrically connected through the corresponding at least one of the dummy pixel electrodes.

3. The display device according to claim 1, wherein each of the effective pixel electrodes and each of the dummy pixel electrodes have the same planar shape.

4. The display device according to claim 1, wherein each of the plurality of pixel circuits is connected to corresponding two or more of the scan lines.

5. The display device according to claim 1, wherein
   a conductive layer including a source electrode and a drain electrode of the thin film transistor is interposed between the plurality of pixel electrodes and the scan lines, and
   the conductive layer includes a portion electrically connecting each of the scan lines and the corresponding at least one of the dummy pixel electrodes.

6. The display device according to claim 1, further comprising:
   an electroluminescence layer on the effective pixel electrodes and not overlapping with the dummy pixel electrodes; and
   a common electrode on the electroluminescence layer.

7. The display device according to claim 6, further comprising a seal layer configured to cover the electroluminescence layer, wherein the seal layer, above the effective pixel electrodes, includes an organic film and a pair of inorganic films sandwiching the organic film from above and below, and the seal layer, above the dummy pixel electrodes, includes the pair of inorganic films in contact with each other and not including the organic film.

8. The display device according to claim 6, further comprising an insulation layer interposed between the plurality of pixel electrodes and the common electrode, wherein the insulation layer has a plurality of openings that expose central portions of the respective effective pixel electrodes, and the insulation layer is configured to cover a periphery of each of the effective pixel electrodes and an entirety of each of the dummy pixel electrodes.

9. A display device comprising:

a plurality of pixel electrodes;

a plurality of pixel circuits below the plurality of pixel electrodes;

some scan lines, each of the scan lines being connected to a corresponding one group of the plurality of pixel circuits; and a scan drive circuit configured to selectively send scanning signals to the scan lines, wherein the plurality of pixel electrodes include effective pixel electrodes corresponding to respective pixels constituting a displayed image, and dummy pixel electrodes between the effective pixel electrodes and the scan drive circuit and corresponding to none of the respective pixels, each of the effective pixel electrodes is connected to a corresponding one of the plurality of pixel circuits, each of the scan lines is electrically connected to the scan drive circuit through a corresponding at least one of the dummy pixel electrodes, and the display device further comprises:

a plurality of micro-LED chips on the respective effective pixel electrodes and not overlapping with the dummy pixel electrodes; and a common electrode on the plurality of micro-LED chips.

* * * * *